United States Patent [19]

Andrews

[11] 3,922,585

[45] Nov. 25, 1975

[54] FEEDBACK AMPLIFIER CIRCUIT

[75] Inventor: Roland E. Andrews, Portland, Oreg.

[73] Assignee: Tektronix, Inc., Beaverton, Oreg.

[22] Filed: Jan. 17, 1974

[21] Appl. No.: 433,993

Related U.S. Application Data

[63] Continuation of Ser. No. 375,890, July 7, 1973, abandoned, which is a continuation of Ser. No. 844,370, July 24, 1969, abandoned.

[52] U.S. Cl. .................... 315/389; 315/396; 330/28

[51] Int. Cl.² .................... H01J 29/72

[58] Field of Search .................... 315/387, 388, 389, 390, 315/403, 404, 405, 396

[56] References Cited

UNITED STATES PATENTS 3,488,551 1/1970 Bryden .................... 315/387

*Primary Examiner*—Maynard R. Wilbur
*Assistant Examiner*—J. M. Potenza
*Attorney, Agent, or Firm*—Klarquist, Sparkman, Campbell, Leigh, Hall & Whinston

[57] ABSTRACT

A feedback amplifier circuit includes a pair of push-pull amplifiers adapted for driving the deflection plates of a cathode ray tube, with each amplifier being provided with a negative feedback circuit including an active amplifying device. As a result of the employment of an amplifying device in each feedback circuit, the conductive loading of output stages is reduced, and therefore the standing current which must be supplied to the amplifier circuit is also reduced.

13 Claims, 5 Drawing Figures

ROLAND E. ANDREWS
*INVENTOR*
*BY*
*BUCKHORN, BLORE, KLARQUIST & SPARKMAN*
*ATTORNEYS*

ROLAND E. ANDREWS
*INVENTOR*
*BY*
*BUCKHORN, BLORE, KLARQUIST & SPARKMAN*
*ATTORNEYS*

FEEDBACK AMPLIFIER CIRCUIT

This is a continuation of application Ser. No. 375,890, filed July 7, 1973, now abandoned, which is a continuation of application Ser. No. 844,370, filed July 24, 1969, now abandoned.

BACKGROUND OF THE INVENTION

Negative feedback amplifiers are advantageously employed for driving the deflection plates of a cathode ray tube, for example the horizontal deflection plates thereof, for bringing about horizontal deflection of the tube's electron beam. Such an amplifier is adapted to provide sufficient displacement current for charging the capacitance represented by the deflection plates whereby a ramp deflection voltage may faithfully appear at the deflection plates. In the instance of a cathode ray oscilloscope, the aforementioned amplifier must operate to provide a substantially linear output over a wide range of deflection speeds. Sufficient standing current must ordinarily be supplied to the amplifier output stages for charging the deflection plate capacitance for the highest amplitude and highest deflection rate input signal which may be applied. The usual feedback amplifier circuit includes a feedback resistance which consumes considerable standing current.

SUMMARY OF THE INVENTION

According to the present invention, a feedback amplifier circuit includes an active amplifying means for driving the feedback impedance from the output of the circuit. As a result, less standing current need be provided to the stage, and consequently power drain is minimized. The power and current capabilities of the output stage are conserved for driving the displacement current load comprising cathode ray tube deflection plates or the like. According to a preferred embodiment, a pair of such amplifier circuits are employed for driving a pair of deflection plates in push-pull relation wherein active components including amplifier input stages and feedback stages share common current supplies.

In accordance with further embodiments of the present invention, each amplifier comprises a common emitter transistor stage driving a common base output transistor stage and through which the first stage provides displacement current to the output. The active amplifying device in the feedback circuit comprises an emitter follower transistor stage. The output stage comprising a common base connected transistor suitably receives current through a current source comprising a second common base connected transistor. The emitter of the last mentioned transistor may be driven concurrently with the common base transistor output stage.

It is an object of the present invention to provide an improved feedback amplifier circuit requiring less standing current for minimizing power drain.

It is a further object of the present invention to provide an improved feedback amplifier circuit wherein the power and current capabilities of the output stage are conserved for driving a displacement current load.

It is another object of the present invention to provide an improved feedback amplifier circuit which is responsive up to fast signal rates while maintaining a substantially low standing current, or which is operable at higher speeds with the same standing current.

It is another object of the present invention to provide an improved feedback amplifier circuit wherein a lower transresistance may be employed for improving operation at higher speeds.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawings wherein like reference characters refer to like elements.

DRAWINGS

DETAILED DESCRIPTION

Figures 1, 2, 3, 4:
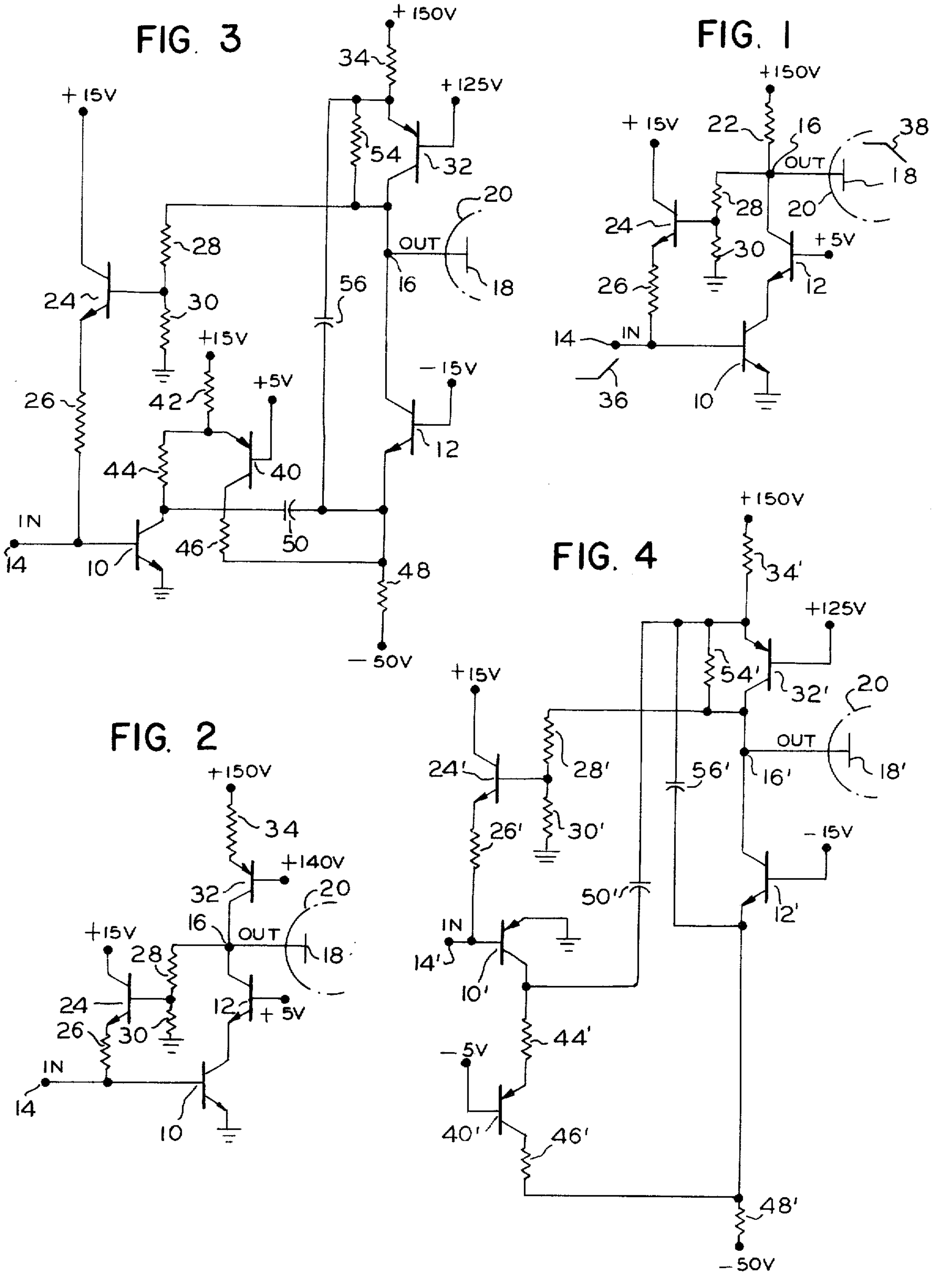
FIG. 1 is a schematic diagram of a first feedback amplifier circuit according to the present invention suitable for driving a deflection plate of a cathode ray tube.
FIG. 2 is a schematic diagram of a second feedback amplifier circuit according to the present invention.
FIG. 3 is a schematic diagram of a third feedback amplifier circuit according to the present invention, which may be employed to drive a deflection plate of a cathode ray tube.
FIG. 4 is a circuit for driving the opposite deflection plate of a cathode ray tube from the deflection plate which the circuit of the FIG. 3 type may be employed to drive.

Referring to FIG. 1, a relatively high gain amplifier circuit according to the present invention comprises transistor 10 and transistor 12 coupled between an input terminal 14 and an output terminal 16. Transistors 10 and 12 form a first amplifying means. The output terminal 16 is suitably connected to a first horizontal deflection plate 18 of a cathode ray tube 20, it being understood the cathode ray tube also includes at least a second horizontal deflection plate in juxtaposed relation with plate 18. Transistor 10, suitably an NPN type, is connected as a common emitter amplifier stage having its base connected to input terminal 14 and its emitter grounded. Its collector is connected to the emitter of transistor 12, the latter being connected as a common base amplifier stage with its base connected to a +5 volts. Transistor 12 is also suitably of the NPN type. The collector of transistor 12 is connected to output terminal 16. A load resistor 22 is interposed between terminal 16 and a source of +150 volts.

As will be well understood by those skilled in the art, a relatively high gain "open loop" amplifier as described above, but further provided with a large amount of feedback and having low output impedance, can provide effective drive for displacement loads such as exemplified by cathode ray tube deflection plates, at relatively high speeds with linear transfer of the input signal to the load. However, appreciable standing current must normally be supplied to the stage for charging the capacitance load and supplying current in the feedback resistance and the like.

A feedback circuit for the amplifier according to the present invention not only includes a passive feedback impedance but also comprises a transistor 24 for driving the same. Transistor 24 has its collector connected to a +15 volts and its emitter coupled to a feedback impedance comprising resistor 26. Feedback resistor 26 is interposed between the transistor emitter and input terminal 14. The base of transistor 24 is connected to the midpoint of the voltage divider including a resistor 28 disposed between output terminal 16 and the base of transistor 24, and a resistor 30 located between the base of transistor 24 and ground. Transistor 24 is connected as an emitter-follower with current gain and is suitably of the NPN type.

Considering operation of the FIG. 1 circuit, a positively increasing input ramp current 36 at terminal 14 results in a negatively decreasing output ramp voltage 38 at plate 18 of cathode ray tube 20. The output 38 linearly follows the input 36 as a result of the feedback action of the circuit. Thus, as the input current at terminal 14 increases a given amount, the output at terminal 16 adjusts in a negative direction until the current provided through transistor 24 and resistor 26 reduces by a similar amount. The actual resulting change in input current at the base of transistor 10 is comparatively small, but due to the amplification of the amplifier means comprising transistors 10 and 12, the output voltage waveform 38 is produced in response thereto. It should be noted that although the input current waveform 36 may rise substantially linearly as indicated in the drawing, the current change delivered at plate 18 via transistor 12 for producing waveform 38 may constitute nearly a negative square wave of current. Such a square wave of current is required for causing the charge at plate 18 to decrease at a constant rate.

The circuit is used generally for driving one deflection plate of the cathode ray tube while another, similar, circuit is employed for driving the opposite deflection plate in the opposite direction. Thus, only a one direction ramp current input, such as illustrated at 36 in FIG. 1, is applied to the circuit, and only a one direction ramp output, such as illustrated at 38, is derived therefrom. The circuit is biased so that in the absence of an input ramp 36, the quiescent current through resistor 22 and transistor 12 may be comparatively low. However, appreciable d.c. standing current would still have to be provided in the usual prior art circuit. According to the present circuit, the value of this standing current can be reduced whereby power drain is minimized, considering the range of inputs which may be processed.

The present circuit reduces the conductive loading of the output transistor 12, and/or reduces the effective transresistance of the amplifier. The transresistance of the amplifier is defined as the ratio of the change in output voltage at terminal 16 to a change in input current at terminal 14 applied for bringing about the output change. In the usual feedback amplifier stage, this transresistance is substantially equal to the value of a feedback resistance itself. The transresistance forms a load which the output transistor 12 has to drive in addition to the displacement current load, here comprising the capacitance of the deflection plates of the cathode ray tube.

As a consequence of the lower conductive loading of the output transistor as achieved by the present circuit employing transistor 24, less standing current need be provided through resistor 22 to the stage, and consequently power drain of the stage is minimized. The power and current capabilities of the output stage are conserved for driving the displacement current load comprising deflection plates or the like. Alternatively, with the same standing current as a stage not employing transistor 24, the present stage is operable at higher speeds. Also, the present circuit permits the effective transresistance to be lowered, and this lower transresistance is conducive to operation at higher speeds for the same amount of distortion because of the improved ratio of effective feedback conductance to stray input capacitance and to the load represented by transistor 10. Thus if the transresistance appears lower at input terminal 14, more input current will appear to flow through the transresistance and less through the somewhat less linear transistor circuitry comprising transistor 10 and transistor 12, resulting in enhanced linearity.

Transistor 24 operates with the voltage input swing that is a part, $a$, of the output swing. Thus, assuming that the ratio of the resistance of resistor 30 to the resistance of resistors 28 plus 30 is $a$, the stabilized gain of the stage including transistor 24 is $aAR_T/aR_T = A$. $R_T$ is the effective transresistance of the overall circuit. Resistor 26 has a resistance equalling $aR_T$. If resistor 28 has a value of 0 ohms, then the effective transresistance of the stage would equal the value of resistor 26. The circuit increases the resistance load of the feedback resistor at the output by a factor A, and reduces to factor $a$ the voltage requirements for resistor 26 and transistor 24. Thus, the feedback circuit from the output appears to have a resistance $AR_T$ and a portion $a$ of this output is applied at the base of transistor 24. A comparatively small current flows in resistors 28 and 30.

The portion of the circuit comprising transistors 10 and 12 has a number of advantages in the overall circuit. Transistor 12 is generally a high voltage, limited $f_t$, output transistor and the present connection makes possible the best performance thereof. Also, this circuit connection eliminates feedback through the collector-base capacitance of transistor 12 which would become a load to be driven if a common emitter configuration were employed for transistor 12. Of course, feedback current through interelectrode capacitances to the input terminal is also isolated by virtue of the fact that transistor 10 separates transistor 12 from input terminal 14. Without such isolation, feedback capacitance would tend to slow down operation of the circuit. Although more gain might be achieved in the transistor 10-transistor 12 amplifier means if transistor 12 were connected in a common emitter configuration, the additional gain is not required because of the employment of transistor 24 in the feedback path. As a result, a more stable circuit and one having excellent performance is achieved.

In FIG. 2 a similar circuit is illustrated wherein like elements are referred to by like reference numerals, but an additional improvement is included for further "unloading" the output stage for reducing the standing current required. The load resistor 22 in FIG. 1 does require some change of current as an input ramp is applied at terminal 14. In the FIG. 2 embodiment, a transistor 32, in series with resistor 34, is substituted for resistor 22, and transistor 32 substantially comprises a current source. The resistor 34 is coupled between a +150 volts and the emitter of transistor 32, while the collector of transistor 32 is connected to output terminal 16. A +140 volts is applied to the base of transistor 32. The current through transistor 32 changes very little with change of voltage at terminal 16. Thus, the output stage comprising transistor 12 does not have to supply a change of current through a load resistance.

FIG. 3 illustrates further additions to the circuit according to the present invention. In this circuit, wherein similar elements are referred to employing similar reference numerals, an additional transistor 40 has its emitter connected to the midpoint of a voltage divider comprising resistors 42 and 44 disposed in that order between a +15 volts and the collector of transistor 10. The base of transistor 40 is connected to a +5 volts, and its collector is coupled to the emitter of transistor 12 via resistor 46. A resistor 48 is interposed between the emitter of transistor 12 and a –50 volts, and coupling capacitor 50 is located between the collector of transistor 10 and the emitter of transistor 12. The employment of the common base amplifier stage comprising transistor 40 between transistors 10 and 12 enables an ease of selection of input and output d.c. levels. However, the high frequency path is by way of only the common emitter input stage and the common base output stage through coupling capacitor 50. The high frequency path including capacitor 50 enables delivery to the capacitance load, comprising the deflection plates of the cathode ray tube, of a displacement current for a one-direction ramp voltage output which is substantially directly from low voltage-high performance input transistor 10. Displacement currents many times larger than the nominal operating current of transistor 12, for example, are possible with this circuit.

Not only is the ease in biasing the output level with respect to the input d.c. level permitted, but also, with the addition of transistor 40, the selection of a higher quiescent current for transistor 10 than for transistor 12 is possible, which is useful in providing a faster ramp recovery rate.

Resistor 54 is connected across transistor 32 to reduce the maximum power dissipation of this transistor. Capacitor 56 connected from the emitter of transistor 12 to the emitter of transistor 32 improves performance of the negative-going output of the circuit by turning off transistor 32 as transistor 12 conducts more current. Thus, transistor 32 is now operativve as a part of the output driving means rather than operating only as a current source. Transistor 32 with resistor 54 operates as a current source on a d.c. basis.

Capacitor 56 also improves the positive-going recovery rate of the output by making available to transistor 32 the standing current in resistor 44 during the time when the output returns positive. Thus, as the input waveform applied at terminal 14 returns negative, the current in resistor 44 is now available to transistor 32.

Thus far a circuit has been described for driving one deflection plate of a pair of deflection plates. Under quiescent conditions, relatively low standing current is provided to this stage, but sufficient current is developed under transient conditions for driving deflection plate 18. A similar circuit is employed to drive the plate opposite plate 18. Such a circuit is illustrated in FIG. 4 where a plate opposite plate 18 is numbered 18'. The FIG. 4 circuit is quite similar to the FIG. 3 circuit, and similar components are referred to employing similar reference numerals. The circuit will be described principally in connection with its differences.

The input transistor 10' in FIG. 4 is conveniently a PNP transistor instead of an NPN transistor, and the base of transistor 40' is connected to a –5 volts instead of a +5 volts. Employing a PNP transistor for transistor 40', the output ramp again corresponds to input transistor turn-on and can be many times the nominal current of transistor 10'. Also, capacitor 50' is coupled from the collector of transistor 10' to the emitter of transistor 32' rather than to the emitter of transistor 12'.

The circuit of FIG. 4 may be driven in push-pull relation with the circuit of FIG. 3. That is, as a positive going ramp is applied to input terminal 14 of FIG. 3, a similar negative-going ramp is applied to input terminal 14' of FIG. 4. At this time, transistor 10' drives transistor 12' through transistor 40' so that transistor 12' supplies less current at terminal 16'. At the same time, coupling capacitor 50' drives the emitter of transistor 32' positively causing transistor 32' to deliver current at output terminal 16'. Transistor 32' is in this instance the principal active element in the output stage, with the a.c. input signal at the emitter of transistor 32' being coupled to the emitter of transistor 12' via capacitor 56'. As transistor 32' supplies output terminal 16' to produce a positive-going ramp at deflection plate 18', transistor 12' tends to cut off. The circuit involving transistors 12' and 32' may be viewed as the reverse of the circuit involving transistors 12 and 32 in FIG. 3. Transistor 12' now principally becomes a current source for d.c. currents and which is driven for a.c. transient currents via capacitor 56', and transistor 32' is an output transistor.

Figure 5:
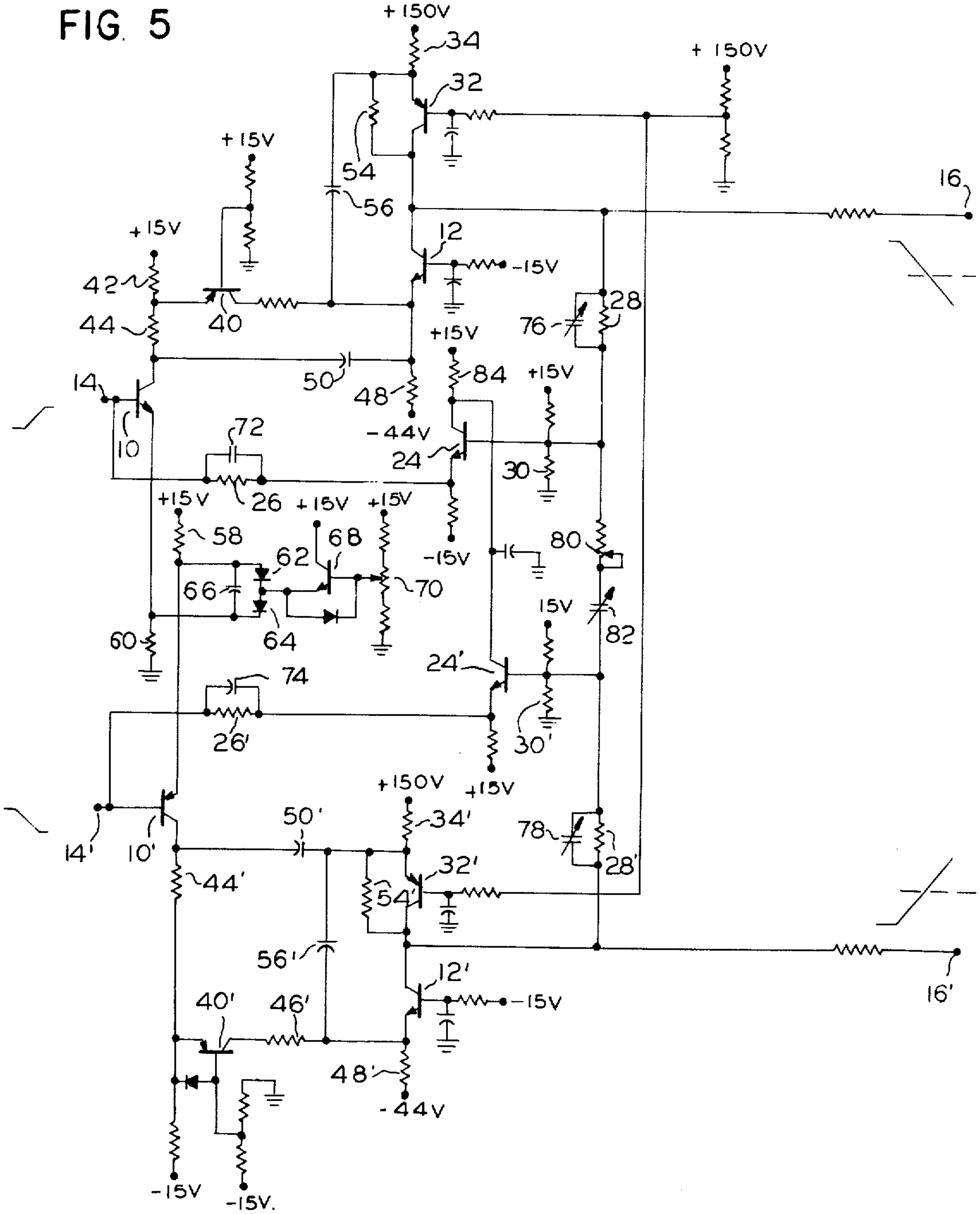
FIG. 5 is a combined push-pull feedback amplifier circuit according to the present invention suitable for driving a pair of cathode ray tube deflection plates.

FIG. 5 illustrates amplifier circuits of the FIG. 3 and FIG. 4 types which receive opposite polarity input current ramps and which provide opposite polarity voltage ramps at terminals 16 and 16' suitably connected to the electrostatic deflection plates of a cathode ray tube. In FIG. 5, the same reference numerals are employed as in the foregoing figures. The diodes 62 and 64 in FIG. 5 provide voltage biasing that results in the inputs to the positive and negative sides of the amplifier at the bases of transistors 10 and 10' being at substantially the same d.c. potential. The emitter of transistor 10 is returned to ground through a resistgor 60 as well as being connected to the cathode of diode 64. The emitter of transistor 10' is coupled to a +15 volts through resistor 58 and is also connected to the anode of diode 62. The cathode of diode 62 and the anode of diode 64 are connected together as well as to the emitter of transistor 68, the base of which receives adjustable voltage at potentiometer 70. Transistor 68 is thus employed for voltage setting adjustment purposes.

Capacitor 72 is shunted across resistor 26, and a capacitor 74 is shunted across resistor 26' for phase adjustment in the feedback circuits. Variable capacitors 76 and 78 disposed respectively in shunt relation with resistors 28 and 28' compensate the voltage dividers 28–30 and 28'–30' over a wide frequency range. These adjustments, together with adjustable resistor 80 in series with adjustable capacitor 82 located between resistors 28 and 28', are employed for optimizing the circuit ramp response at faster rates. In particular, components 80 and 82' compensate for current gain fall off of transistors 24 and 24' at higher frequencies.

The circuit as connected in FIG. 5 for driving the two deflection plates of a cathode ray tube has particular advantages. For a balanced load, the large displacement currents in the circuit are balanced such that no transient current is required of power supplies. For example, the transient emitter currents of input transistors 10 and 10' are common via capacitor 66, and the transient collector currents of transistors 24 and 24' are out of phase through resistor 84 and thus cancel. Since transient current is not required of a power supply, less interference with other circuits associated with the same power supply is caused by the large displacement current waveforms required to drive the deflection plate capacitance.

The circuit is responsive up to fast ramp rates of input while maintaining a substantially low standing current. The input repetition rate, however, should remain within certain limits for the circuit to operate properly. This will ordinarily be the case in the instance of the electrostatic deflection plates of an oscilloscope, wherein deflection is to be triggered at successive repetitions of an input signal. In the present circuit, as illustrated in FIGS. 3, 4, or 5, the fast transient current applied at the output terminal or terminals via the output transistor (12 or 32') is in general supplied from the input transistor (10 or 10'). This is the source of the relatively large current step required to generate the fast voltage ramp output at the capacitance load. However, as the repetition frequency of the input is increased, the bias current in the output transistors drops during inter-ramp intervals. A frequency can be reached where one or both of the output transistors 12 and 32' in the FIG. 5 circuit are biased off at the beginning of a desired ramp interval. It is assumed the emitter-to-emitter capacitors 56 and 56' are sufficiently large that negligible voltage change occurs across them in steady state repetitive ramp operation. When the average displacement current of the total capacitance load reaches a minimum operating current for an output transistor, e.g., transistor 12 in FIG. 3, that transistor will undesirably turn off during a portion of the cycle. It is generally desirable for driving of the deflection plates of a cathode ray tube that this does not occur, and hence the repetition rate of the input ramp should not increase beyond a given value. For a circuit of the FIG. 5 type, the total capacitance load in a particular instance was about 24 picofarads, tht total ramp amplitude was 110 volts, and the minimum average operating current value was 4 ma. From these quantities, a maximum value for ramp repetition frequency before encountering transistor turn off is about 1.5 megahertz. This value is not to be taken in a limiting sense and depends upon circuit design.

While I have shown and described several embodiments of my invention, it will be apparent to those skilled in the art that many changes and modifications may be made without departing from my invention in its broader aspects.

I claim:

1. A feedback amplifier circuit including at least a first amplifying means having an input and an output and exhibiting an open loop gain at said output as compared with said input, said first amplifying means comprising a first common emitter transistor stage driving a second common base transistor stage with the latter providing said output of said first amplifying means and of said amplifier circuit, and negative feedback means coupling said output to said input of said first amplifying means over a range of frequencies at which said first amplifying means operates, said feedback means including a second amplifying means having an input and an output, wherein the input of the second amplifying means is coupled to receive the output of the first amplifying means and impedance means coupling the output of said second amplifying means to the input of the first amplifying means, said second amplifying means comprising an emitter-follower transistor stage coupled from the output of said first amplifying means to said impedance means.

2. The amplifier circuit according to claim 1 wherein said emitter-follower stage is coupled to said common base transistor stage by means of a voltage divider connected at one end thereof to the output of the first amplifying means and provided with a tap thereon connected to the base terminal of said emitter-follower stage.

3. The circuit according to claim 1 further including a current source for said first amplifying means, said current source comprising a fourth transistor having its emitter coupled to a source of voltage and its collector coupled to the collector terminal of said common base transistor stage.

4. The circuit according to claim 3 further including a capacitor coupling the emitter of said common emitter transistor stage to the emitter of said fourth transistor for also driving said fourth transistor.

5. The circuit according to claim 4 adapted to drive a deflection plate of a cathode ray tube and further including a substantially similar circuit driving an opposite deflection plate of the cathode ray tube, said substantially similar circuit differing in the polarity of input signal provided thereto and in the conductivity type of said common-emitter stage.

6. The circuit according to claim 4 further including an additional common base transistor stage interposed in coupling relation between the collector of said common emitter transistor stage and the emitter of said first mentioned common base transistor stage, said circuit further including an a.c. coupling capacitor between the collector of said common emitter transistor stage and the emitter of said first mentioned common base transistor stage.

7. The circuit according to claim 1 wherein said first amplifying means is biased to a low current state and is adapted to receive inputs of a given relative polarity for causing said first amplifying means to draw increased current.

8. A feedback amplifier circuit for driving first and second deflection plates of a cathode ray tube, said circuit comprising:

a first feedback amplifier for driving a first deflection plate of said cathode ray tube, said first amplifier receiving a current input ramp and providing in response thereto a voltage output ramp at said first deflection plate, said first amplifier having a feedback circuit including active amplifying means for coupling a negative feedback signal from the output to the input of said first amplifier, a second feedback amplifier receiving the current ramp input and providing a voltage ramp output for driving said second deflection plate in substantially push-pull relation with the first deflection plate, said second amplifier having a feedback circuit including an active amplifying means coupling a negative feedback signal from the output to the input of said second amplifier, and means intercoupling said first and second amplifiers for transient exchange of currents therebetween.

9. The circuit according to claim 8 wherein first stages of said first and second feedback amplifiers are provided with a common current return.

10. The circuit according to claim 8 wherein said active amplifying means in the feedback circuits of said first and second amplifiers are provided with a common current supply.

11. The circuit according to claim 8 wherein each of said amplifiers comprises a common emitter transistor stage driving a common base transistor output stage, and wherein said active amplifying means in the feedback circuit comprises an emitter follower transistor stage.

12. The circuit according to claim 8 wherein the first stage in each amplifier is in each case biased to a low current state and is adapted to receive one of a pair of push-pull inputs for causing the amplifier to draw increased current.

13. A feedback amplifier circuit comprising:

first transistor means having an input and an output, second plural transistor means having an input and an output and including common collector means therebetween, said output of said first transistor means being connected to said input of said second transistor means defining emitter means thereof, negative feedback means connected from said output of said second transistor means to said input of said first transistor means, and impedance means included in said negative feedback means.

* * * * *